United States Patent
Hayashi et al.

(10) Patent No.: US 9,961,804 B2
(45) Date of Patent: May 1, 2018

(54) COOLING APPARATUS AND ELECTRONIC DEVICE

(71) Applicant: FUJITSU LIMITED, Kawasaki-shi, Kanagawa (JP)

(72) Inventors: Nobuyuki Hayashi, Yokohama (JP); Teru Nakanishi, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/384,790

(22) Filed: Dec. 20, 2016

(65) Prior Publication Data

US 2017/0245398 A1    Aug. 24, 2017

(30) Foreign Application Priority Data

Feb. 19, 2016 (JP) ................................. 2016-029719

(51) Int. Cl.
*H05K 7/20* (2006.01)

(52) U.S. Cl.
CPC ..... *H05K 7/20809* (2013.01); *H05K 7/20154* (2013.01); *H05K 7/20309* (2013.01); *H05K 7/20318* (2013.01); *H05K 7/20327* (2013.01)

(58) Field of Classification Search
None
See application file for complete search history.

(56) References Cited

U.S. PATENT DOCUMENTS

| 4,457,364 A * | 7/1984 | DiNicolantonio | C10G 9/002 165/134.1 |
|---|---|---|---|
| 2005/0180105 A1* | 8/2005 | Matsushima | G06F 1/20 361/699 |
| 2005/0244280 A1 | 11/2005 | Malone et al. | |
| 2014/0196872 A1* | 7/2014 | Anwar | F28F 13/12 165/109.1 |

FOREIGN PATENT DOCUMENTS

| JP | 2005-228237 | 8/2005 |
| JP | 2005-315255 | 11/2005 |
| JP | 2007-103470 | 4/2007 |

* cited by examiner

*Primary Examiner* — Dimary Lopez Cruz
*Assistant Examiner* — Zhengfu Feng
(74) *Attorney, Agent, or Firm* — Fujitsu Patent Center

(57) ABSTRACT

A cooling apparatus includes: a circulation path of coolant; a first pump provided in the circulation path, the first pump including a first inlet and a first outlet; a second pump connected to the first pump, the second pump including a second inlet and a second outlet; a first main pipe with one end connected to the first outlet; a second main pipe with one end connected to the second inlet; a connection portion connecting another ends of the first and second main pipe; a first bypass pipe connecting the first inlet and the connection portion; and a second bypass pipe connecting the second outlet and the connection portion, wherein the first main pipe and the second bypass pipe are connected in a same direction in the connection portion, and the second main pipe and the first bypass pipe are connected in the same direction.

6 Claims, 15 Drawing Sheets

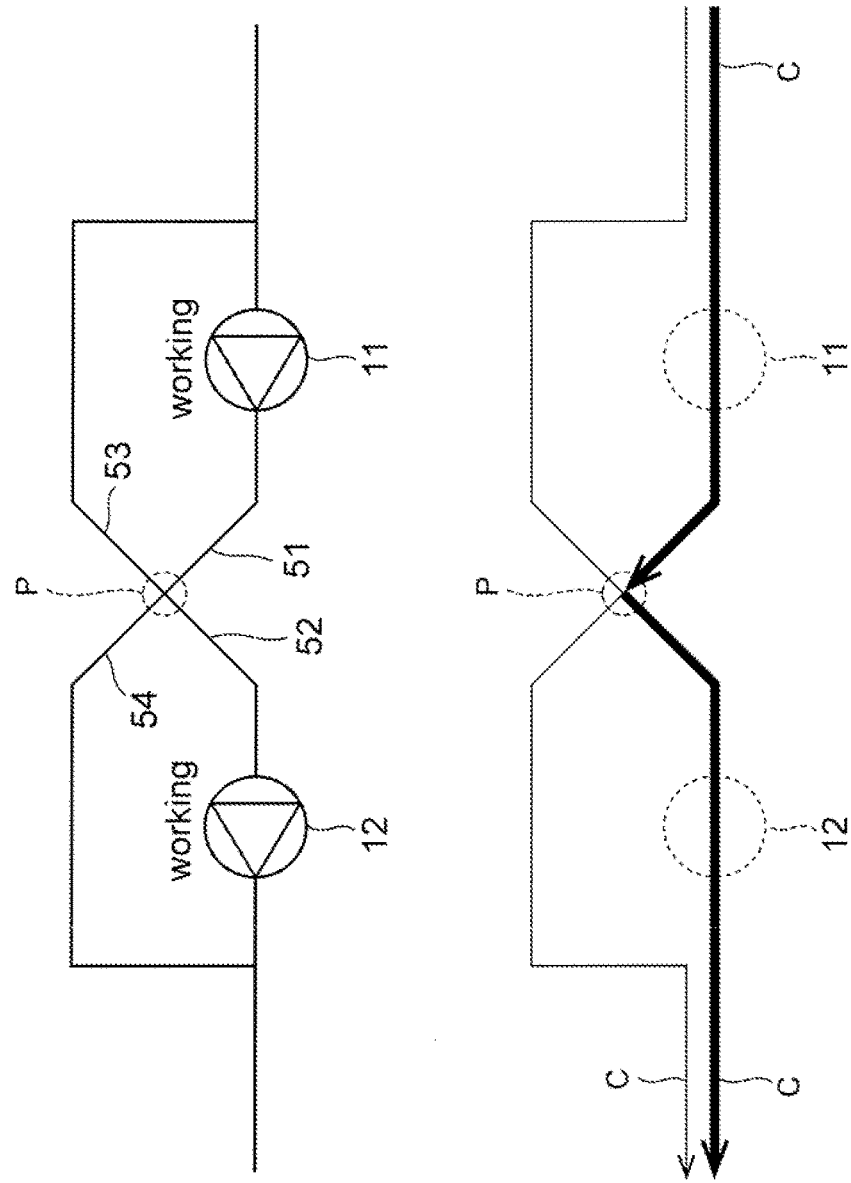

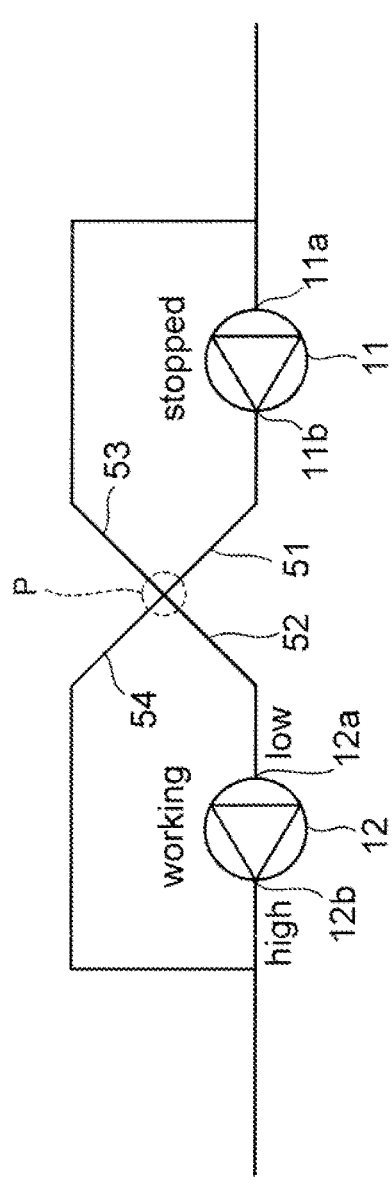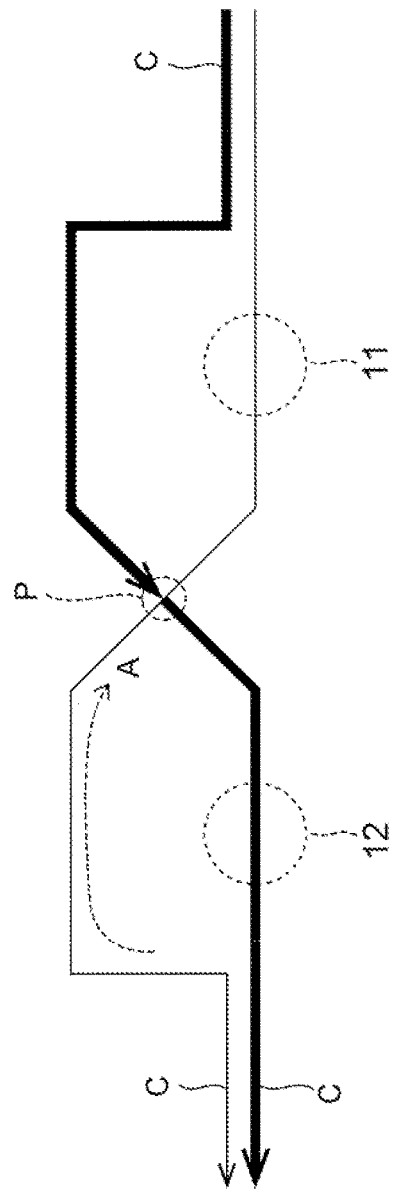
FIG.11A
FIG.11B

FIG.13

| | comparative example | | present embodiment | |
|---|---|---|---|---|
| | normal operation | one pump stopped | normal operation | one pump stopped |
| output of first pump 11 | 100% [working] | 100% [working] | 100% [working] | 100% [working] |
| output of second pump 12 | 100% [working] | 0% [stopped] | 100% [working] | 0% [stopped] |
| total flow rate [ml/min] | 460 | 310 | 530 | 390 |
| | 11 working, 12 working (13, 14) | 11 working, 12 stopped (13, 14) | 11 working, 12 working (53, 54 crossed) | 11 working, 12 stopped (53, 54 crossed) |

COOLING APPARATUS AND ELECTRONIC DEVICE

This application is based upon and claims the benefit of priority of the prior Japanese Patent Application No. 2016-29719, filed on Feb. 19, 2016, the entire contents of which are incorporated herein by reference.

FIELD

The embodiments discussed herein are related to a cooling apparatus and an electronic device.

BACKGROUND

Air cooling and liquid cooling are used for cooling electronic devices such as servers. The liquid cooling is a method of cooling electronic devices using the evaporation heat and the sensible heat of coolant, and is capable of cooling the electronic devices more efficiently than the air cooling.

In the liquid cooling system, pumps are provided for circulating coolant in the electronic device. When there is only one pump in the system, the circulation of the coolant is stopped when the pump breaks down, resulting in the situation where the electronic device cannot be cooled. To prevent such a situation, it is effective to provide a plurality of pumps to make the pumps redundant so that even when one of the pumps fails, the other pumps can keep circulating the coolant.

However, the system of the redundant pumps still has room of improvement in increasing the flow rate of the circulating coolant.

Note that techniques related to this application are disclosed in Japanese Laid-open Patent Publications Nos. 2005-315255, 2007-103470, and 2005-228237.

SUMMARY

According to one aspect discussed herein, there is provided a cooling apparatus including: a circulation path in which a coolant circulates, where the coolant cooling an electronic component; a first pump provided in the circulation path, the first pump including a first inlet configured to take in the coolant and a first outlet configured to discharge the coolant; a second pump connected to the first pump in series in the circulation path, the second pump including a second inlet configured to take in the coolant and a second outlet configured to discharge the coolant; a first main pipe with one end that is connected to the first outlet; a second main pipe with one end that is connected to the second inlet; a connection portion configured to connect another end of the first main pipe and another end of the second main pipe; a first bypass pipe configured to bypass the first pump by connecting the first inlet side of the first pump and the connection portion; and a second bypass pipe configured to bypass the second pump by connecting the second outlet side of the second pump and the connection portion, wherein the first main pipe and the second bypass pipe are connected in a same direction in the connection portion, and the second main pipe and the first bypass pipe are connected in a same direction in the connection portion.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 10A is a diagram schematically illustrating a case where both a first pump and a second pump are working in the present embodiment;

FIG. 10B is a diagram schematically illustrating a flow of the coolant in the case where both the first pump and the second pump are working in the present embodiment;

FIG. 11A is a diagram schematically illustrating a case where the first pump is stopped and the second pump is working in the present embodiment;

FIG. 11B is a diagram schematically illustrating a flow of the coolant in the case where the first pump is stopped and the second pump is working in the present embodiment;

FIG. 13 is a diagram indicating an investigation result about to what extent the backward flow is reduced in the present embodiment;

DESCRIPTION OF EMBODIMENTS

Prior to describing an embodiment, descriptions are provided for a study conducted by the inventors of the present application.

Figure 1:
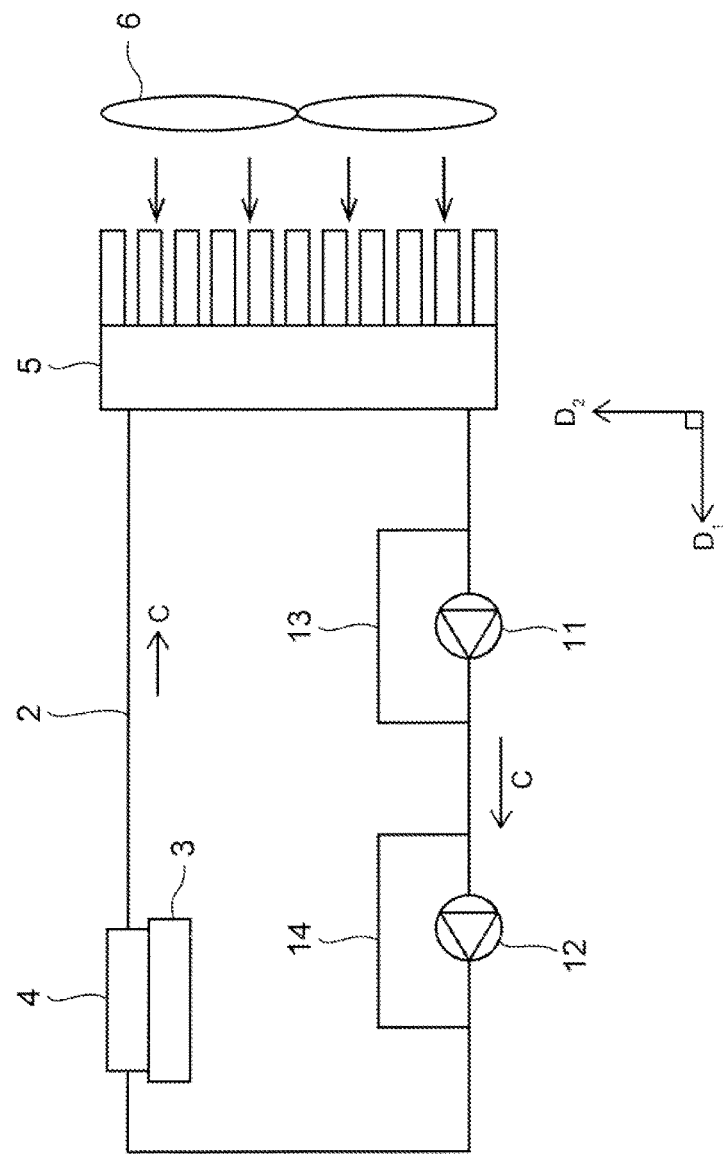
FIG. 1 is a structural diagram of a cooling apparatus used in a study.

FIG. 1 is a structural diagram of a cooling apparatus used in this study.

This cooling apparatus 1 is housed in an electronic device such as a server, and has a circulation path 2 through which coolant C circulates.

On the circulation path 2, an evaporator 4 and a condenser 5 are provided.

The evaporator 4 is adhered to an electronic component 3 such as a central processing unit (CPU) which is an object to be cooled down. The evaporator 4 receives heat from the electronic component 3 to evaporate the coolant C, and thus cools the electronic component 3 by the evaporation heat of the coolant C.

The condenser 5 receives air flow created by a fan 6, and thus cools vapor of the coolant C to liquefy the coolant C.

In addition, on the circulation path 2, a first pump 11 and a second pump 12 are provided for circulating the coolant C.

Since the two pumps 11 and 12 are provided in this manner, even in the case where one of the pumps breaks down, the other can circulate the coolant C, so that it is possible to prevent insufficient cooling of the electronic component 3.

As methods of connecting the first pump 11 and the second pump 12, there are parallel connection and series connection. In this example, the pumps 11 and 12 are connected in series along the direction $D_1$ in which the coolant flows, thereby preventing the pumps 11 and 12 from occupying a wide area in direction $D_2$ orthogonal to direction $D_1$, which in turn saves the space of the electronic device.

In addition, in this example, a first bypass pipe 13 is provided to the first pump 11, and a second bypass pipe 14 is provided to the second pump 12. Thus, the bypass pipe 13 or 14 provides a flow passage in the case where one of the pumps is stopped.

For example, when the first pump 11 is stopped, the coolant C flows through the first bypass pipe 13 by the driving force of the second pump 12, so that the coolant C can keep circulating through the circulation path 2.

However, the study conducted by the inventors revealed that this structure has the following problem.

Figure 2:
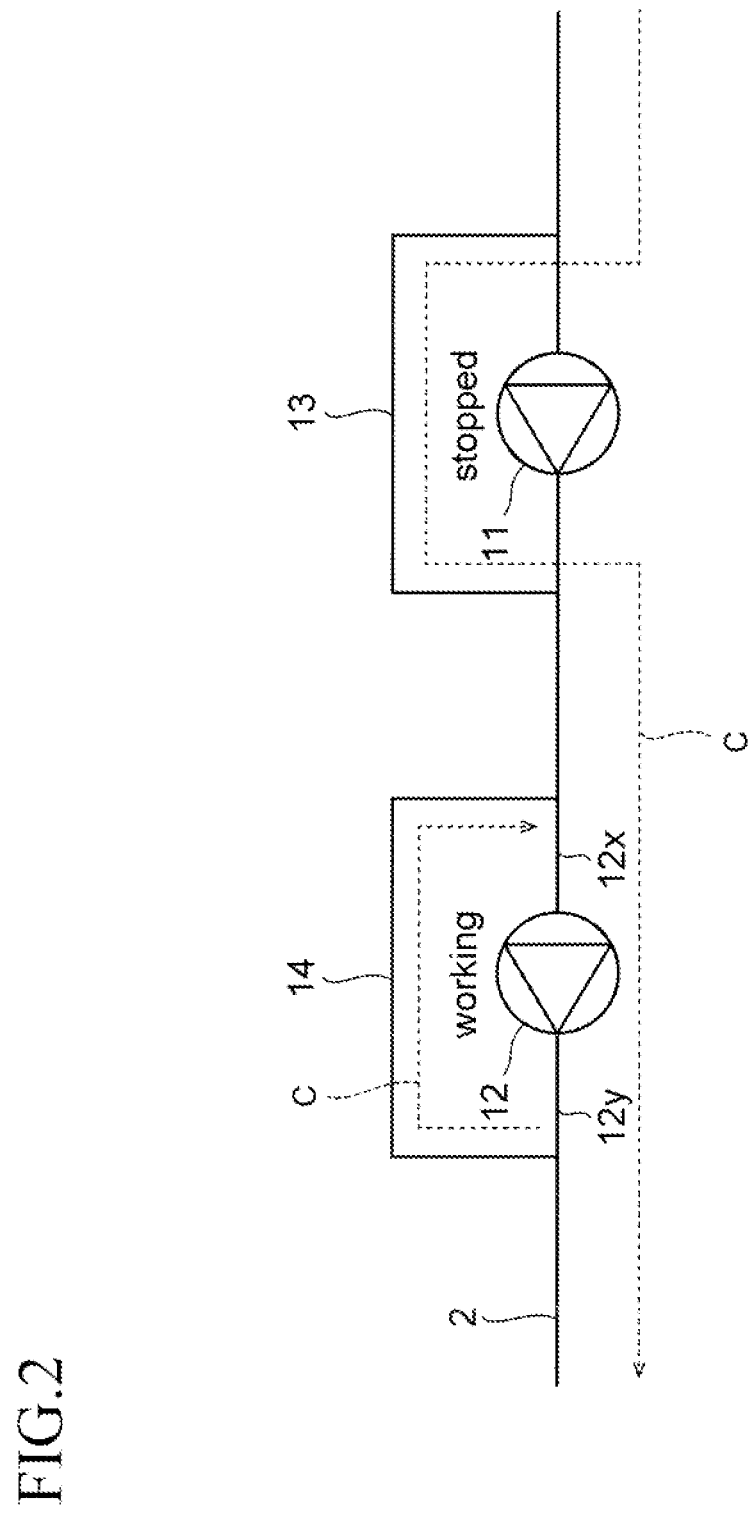
FIG. 2 is a schematic diagram illustrating a problem of the cooling apparatus used in the study.

FIG. 2 is a schematic diagram illustrating the problem.

In the example of FIG. 2, it is assumed that the first pump 11 is stopped and the second pump 12 is working.

In this case, the coolant C is flowing through the first bypass pipe 13 in the right direction, in such a manner that the coolant C bypasses the stopped first pump 11.

Meanwhile, at the downstream 12y of the working second pump 12, the pressure of the coolant C becomes higher than that at the upstream 12x, because of the coolant C discharged from the second pump 12. Because the coolant C tends to flow from a part where the pressure is high to a part where the pressure is low, a backward flow occurs in the second bypass pipe 14, in such a manner that the coolant C flows in the opposite direction than that in the first bypass pipe 13.

When the backward flow occurs in this manner, the flow rate of the coolant C discharged from the second pump 12 reduces, thereby making it difficult to efficiently cool the electronic component 3 by the coolant C.

Figure 3:
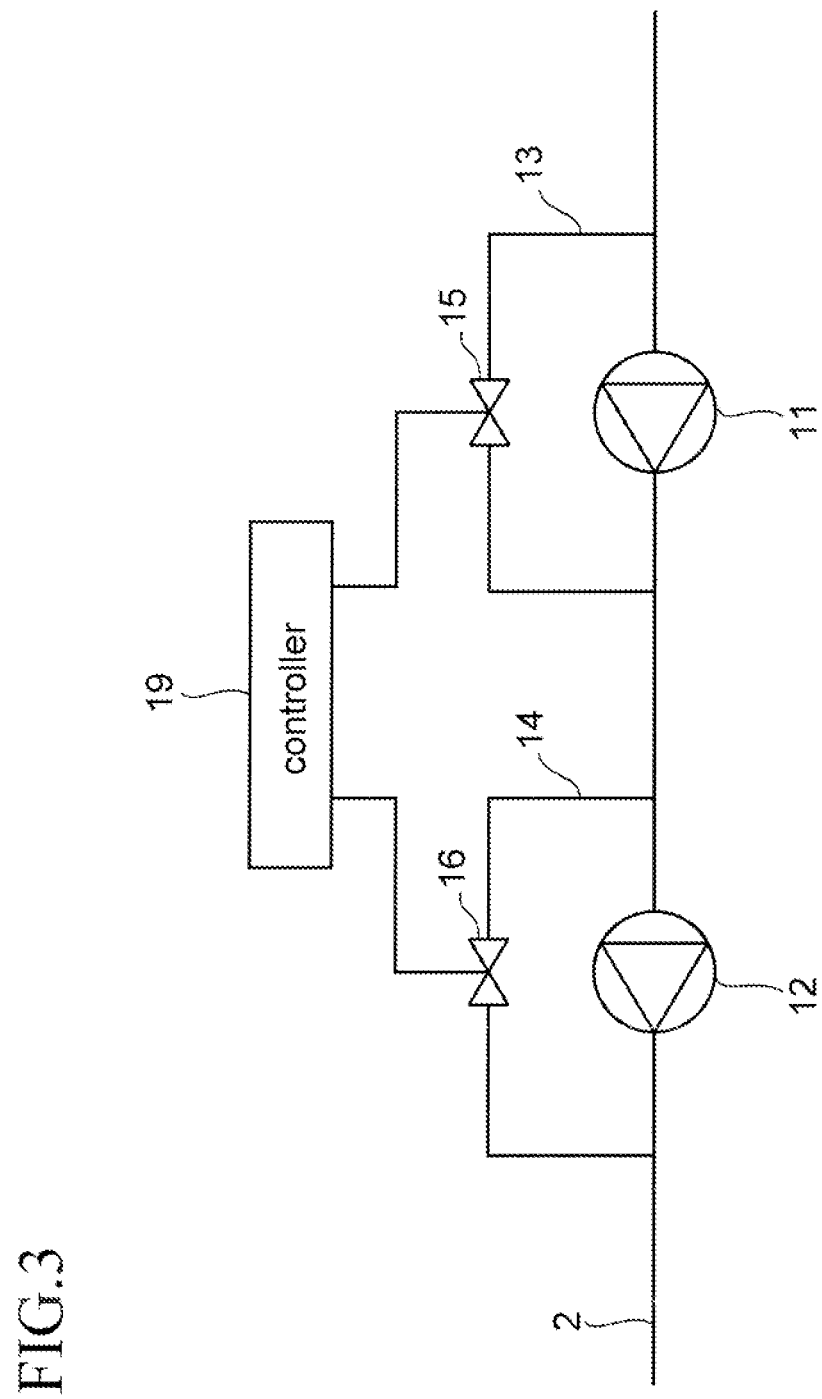
FIG. 3 is a diagram schematically illustrating a structure studied to prevent a backward flow of coolant.

FIG. 3 is a diagram schematically illustrating a structure studied to prevent the backward flow.

In the example in FIG. 3, a first check valve and a second check valve 16 are provided on the first bypass pipe 13 and the second bypass pipe 14, respectively. The opening and closing of these check valves 15 and 16 are controlled by a controller 19.

Figure 4:
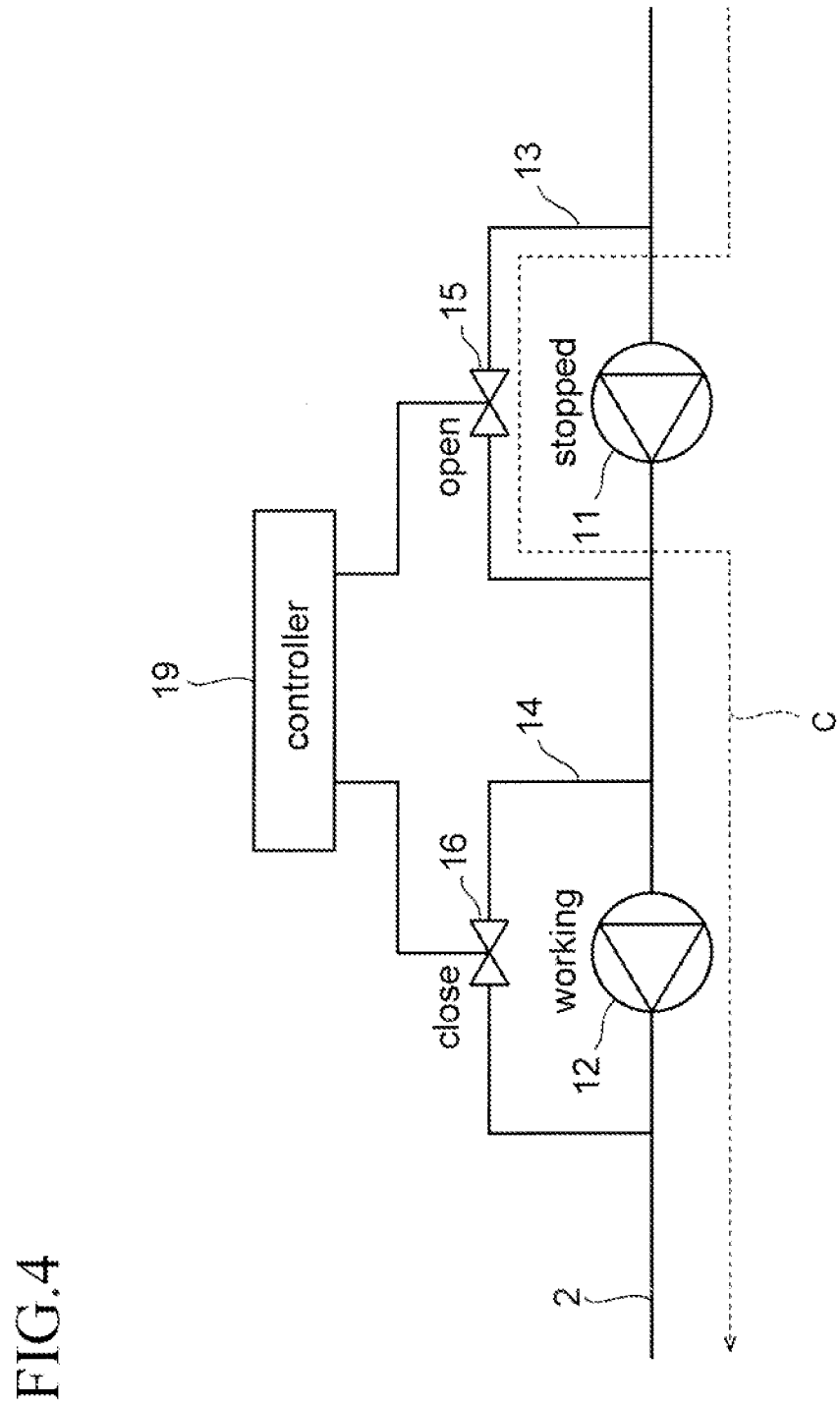
FIG. 4 is a diagram schematically illustrating a situation where the coolant flows through a circulation path.

FIG. 4 is a diagram schematically illustrating a situation where the coolant C flows through the circulation path 2 in this case.

In the example in FIG. 4, it is assumed that the first pump 11 is stopped and the second pump 12 is working as in the example of FIG. 2.

In this case, by opening the first check valve 15 under the control of the controller 19, the coolant C bypassing the first pump 11 can flow through the first bypass pipe 13.

In addition, by closing the second check valve 16 under the control of the controller 19, it is possible to prevent the coolant C from flowing backward through the second bypass pipe 14.

Note that in the case where the first pump 11 is working and the second pump 12 is stopped, the opening and closing states of the first check valve 15 and the second check valve 16 may be reversed.

According to this structure, the backward flow of the coolant C, which flows through the bypass pipes 13 and 14 backwardly, can be prevented. However, the check valves 15 and 16, and the controller 19 to control the opening and closing of these valves make the apparatus structure more complicated.

In addition, the resistances received from the check valves 15 and 16 would reduce the flow rate of the coolant C. To compensate for the reduction of the flow rate, the rotation speeds of the pumps 11 and have to be increased, resulting in an increase of the electric power consumed by the pumps 11 and 12.

Moreover, in the case where the coolant C contains foreign matters, the foreign matter may be caught at the check valve 15 or 16, and obstruct the flow of the coolant C.

It may be considered that the inner diameters of the bypass pipes 13 and 14 are made larger to reduce the resistance to the coolant C received from the check valves 15 and 16. However, this approach increases the weights of the bypass pipes 13 and 14, preventing the weight reduction of the electronic device. In addition, there is another problem that bending a pipe with a large inner diameter increases the curvature radius of the bent portion of the pipe, making it difficult to achieve downsizing of the electronic device.

In addition, in this structure, three way valves such as T-shaped joints are used at two points to form the first bypass pipe 13 and the second bypass pipe 14 as branch paths from the circulation path 2. Since the T-shaped joint changes the flow direction at a right angle, the friction loss of the coolant C is large. Hence, there is also a problem that pressure losses becomes large at the two points of the circulation path 2.

Hereinafter, descriptions are provided for an embodiment capable of suppressing the backward flow in the bypass pipes without using the check valve.

Present Embodiment

In the present embodiment, an example of cooling servers is described.

Figure 5:
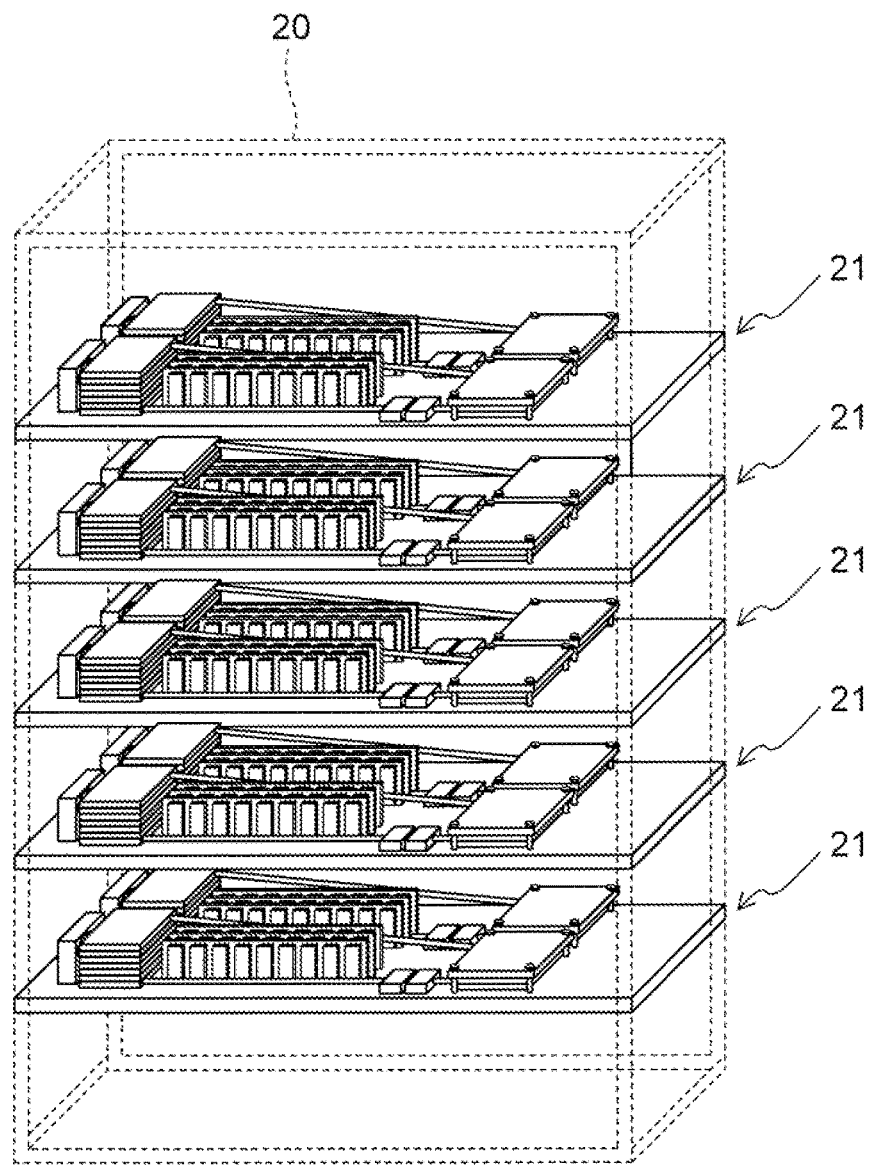
FIG. 5 is a perspective view of a rack housing servers according to a present embodiment.

FIG. 5 is a perspective view of a rack housing the servers.

As illustrated in FIG. 5, the rack 20 houses a plurality of rack-mounted servers 21.

Figure 6:
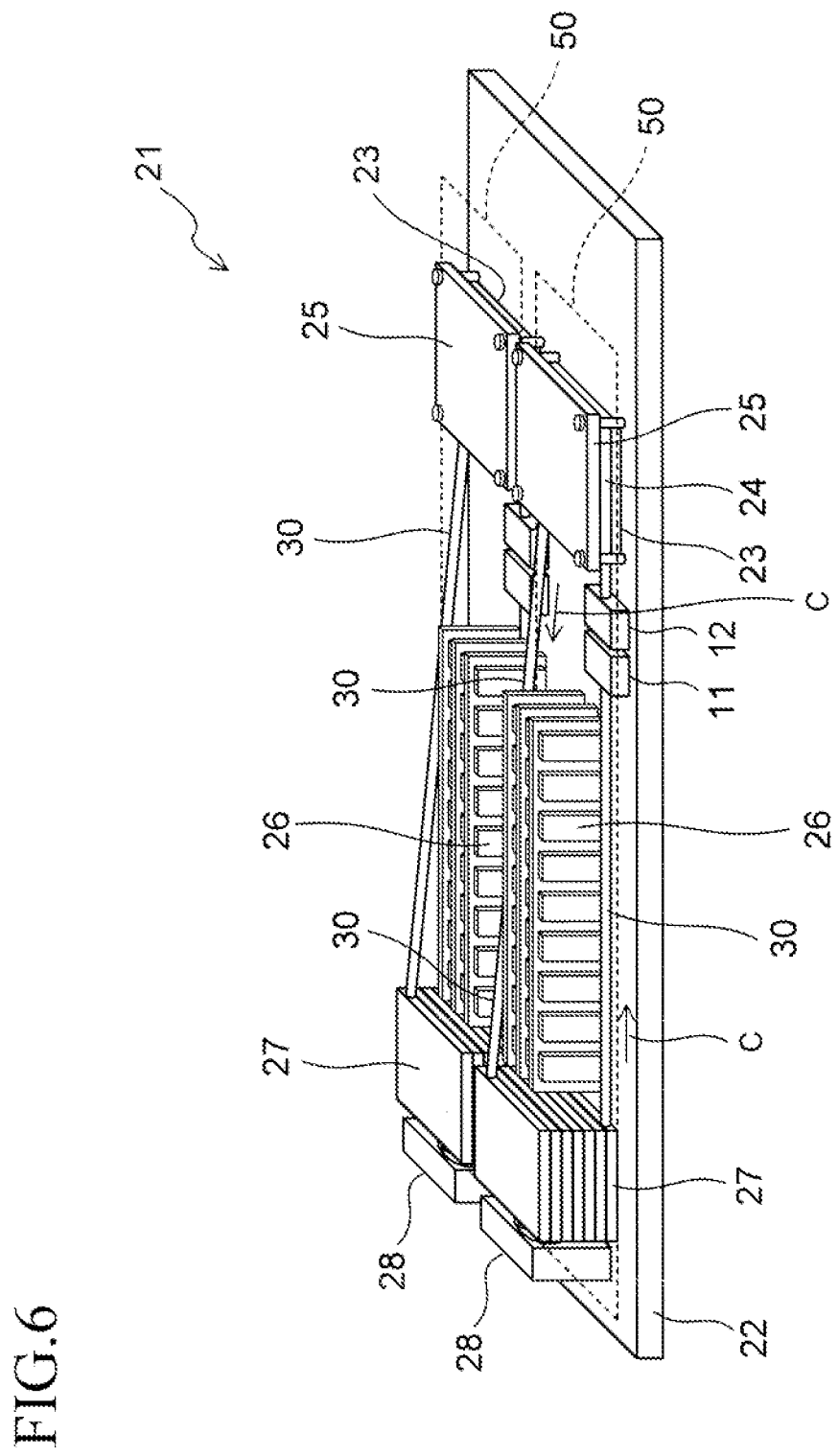
FIG. 6 is a perspective view of a server according to the present embodiment.

FIG. 6 is a perspective view of a server 21.

The server 21 is an example of an electronic device, and includes a circuit board 22 and electronic components 23 such as a CPU mounted thereon.

In this example, the circuit board 22 is provided with two electronic components 23, and two cooling apparatuses 50 are provided for cooling the respective electronic components 23.

Each cooling apparatus 50 includes a loop-shaped circulation path 30 in which coolant C circulates, an evaporator 24, and a condenser 27.

Among them, the evaporator 24 evaporates the coolant C with the heat of the electronic component 23, and thus cools the electronic component 23 with the evaporation heat of the coolant C. The coolant C is not particularly limited. In this embodiment, pure water is used as the coolant C, for example. Note that in order to prevent the pure water from freezing, ethanol may be added to the pure water such that the concentration of the ethanol becomes 0.1 wt % to 5 wt %.

A metal fixing plate 25 is mounted on the evaporator 24. By fixing the fixing plate 25 to the circuit board 22 with screws, the electronic component 23 is fixed to the circuit board 22.

In addition, the circulation path 30 circulates the coolant C between the evaporator 24 and the condenser 27, and may be made by connecting a plurality of pipes, for example. Note that the pipes included in the circulation path 30 are simplified in FIG. 6. Details of the pipes are described later.

In order to fill the circulation path 30 with the coolant C, the coolant C subjected to degassing is supplied to the circulation path 30 after the circulation path 30 is evacuated to about −100 kPa.

In addition, in the circulation path 30, the first pump 11 and the second pump 12 are connected in series for circulating the coolant C. The two pumps provided in this manner make the pumps redundant, so that even when one of the pumps fails and stops, the other pump can keep sending the coolant.

The condenser 27, provided in the circulation path 30, cools and liquefies the coolant C evaporated with the heat of the electronic component 23. Note that fans 28 are fixed beside the condensers 27 on the circuit board 22, and air flows created by the fans 28 promote the heat radiation of the condensers 27.

In addition, memories 26 are mounted on the circuit board 22, which are used for various computations in corporation with the electronic components 23.

Figure 7:
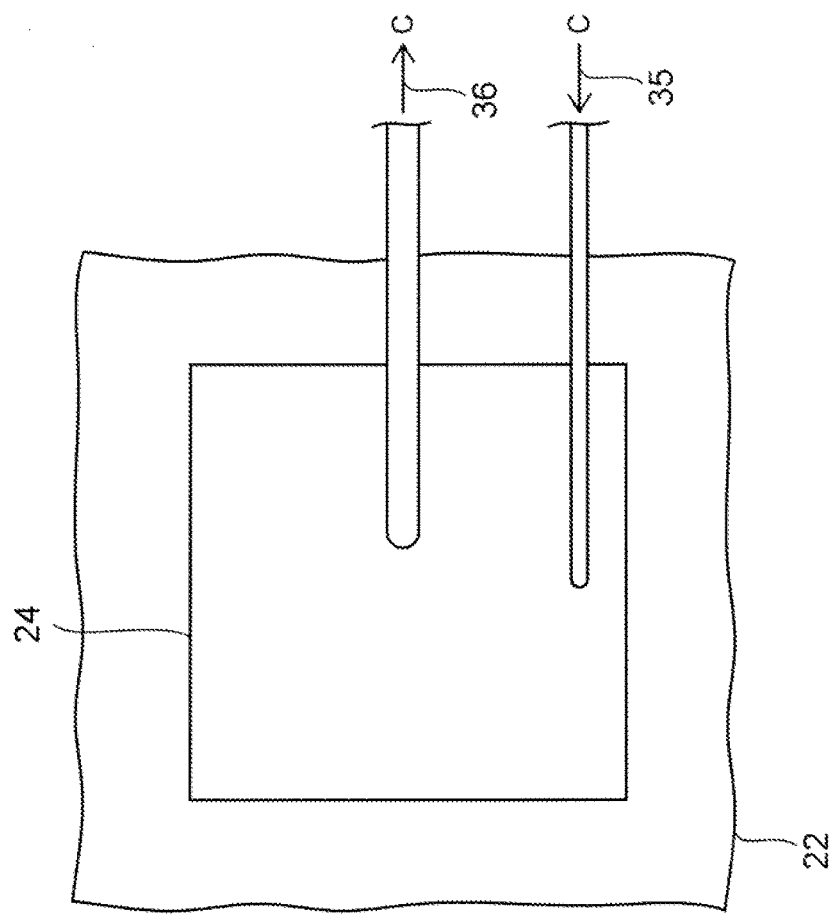
FIG. 7 is a top view of an evaporator and its surroundings according to the present embodiment.

FIG. 7 is a top view of the evaporator 24 and its surroundings.

As illustrated in FIG. 7, a pipe 35 for liquid and a pipe 36 for vapor are connected to the upper surface of the evaporator 24.

The pipe 35 and the pipe 36 are metal pipes which form part of the circulation path 30. The pipe for liquid supplies the coolant C in the liquid phase to the evaporator 24, and the pipe 36 for vapor discharges the vapor of the coolant C from the evaporator 24.

In this example, the diameter of the pipe 36 for vapor is made larger than that of the pipe 35 for liquid to make it easy for the vapor of the coolant C to be pushed out from the evaporator 24 by the pressure in the evaporator 24, making it easy for the coolant C to circulate in the circulation path 30.

Figure 8:
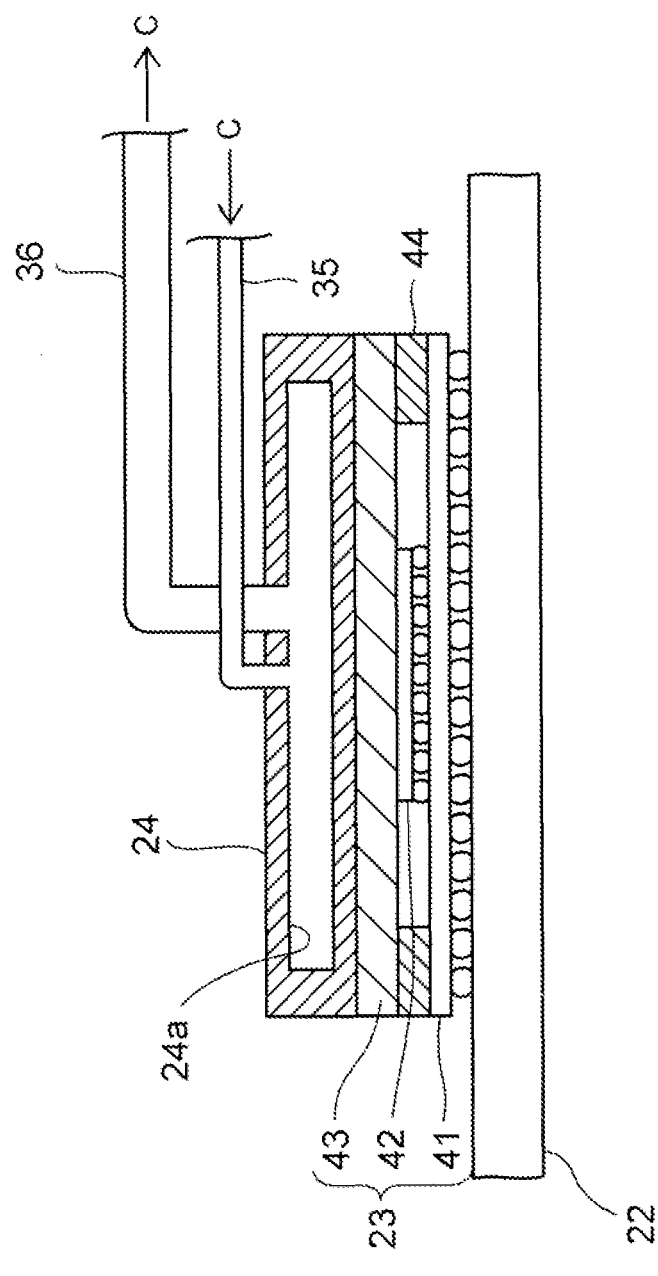
FIG. 8 is a side view partially illustrating a cross section of an electronic component and the evaporator according to the present embodiment.

FIG. 8 is a side view partially illustrating a cross section of the electronic component 23 and the evaporator 24.

As illustrated in FIG. 8, the electronic component 23 includes a circuit board 41 and a semiconductor element 42 mounted thereon, and a metal lid 43 is provided on the upper surface of the semiconductor element 42.

The lid 43 is adhered to the circuit board 41 with adhesive seal material 44, and the evaporator 24 described above is adhered to the upper surface of the lid 43.

A cavity 24 is provided in the evaporator 24. The cavity 24a is supplied with the coolant C in the liquid phase from the pipe 35, and the semiconductor element 42 is cooled by the evaporation heat of the coolant C. The vapor of the coolant C generated in the cavity 24a is discharged from the pipe 36 for vapor as described above.

Note that in order to transfer the heat of the semiconductor element 42 to the evaporator 24 rapidly, thermal interface material (TIM) may be provided between the semiconductor element 42 and the lid 43 and between the lid 43 and the evaporator 24.

Figure 9:
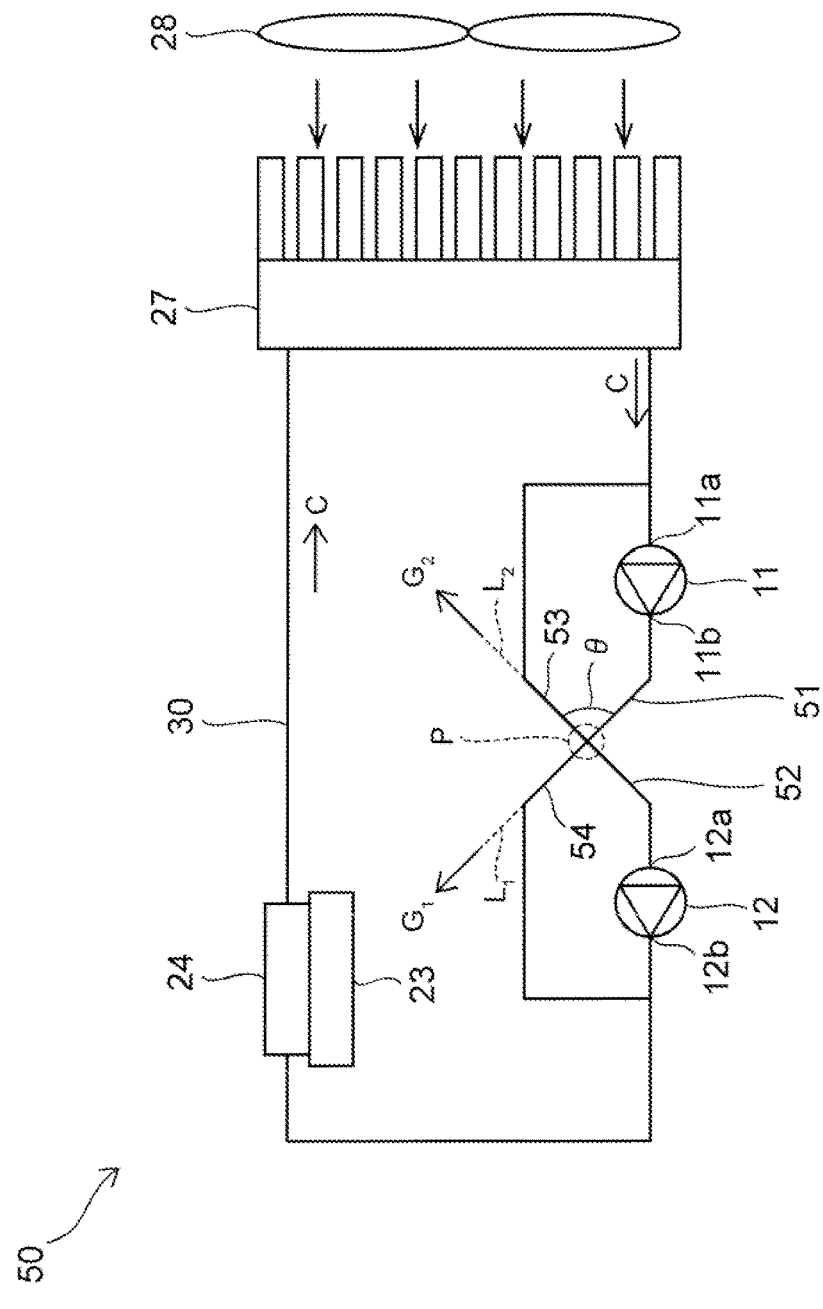
FIG. 9 is a structural diagram of a cooling apparatus according to the present embodiment.

FIG. 9 is a structural diagram of the cooling apparatus 50 according to the present embodiment.

Note that in FIG. 9, the same elements as those described in FIGS. 5 to 8 are denoted by the same reference numerals as those in these figures, and descriptions thereof are omitted below.

As described above, the cooling apparatus 50 includes the loop-shaped circulation path 30 and the first and second pumps 11 and 12 provided in the circulation path 30.

Of the two pumps, the first pump 11 includes a first inlet 11a which takes in the coolant C, and a first outlet 11b which discharges the coolant C. Then, the second pump 12 includes a second inlet 12a which takes in the coolant C, and a second outlet 12b which discharges the coolant C.

The first outlet 11b of the first pump 11 is connected to one end of a first main pipe 51, and the second inlet 12a of the second pump 12 is connected to one end of a second main pipe 52.

The other ends of the first main pipe 51 and the second main pipe 52 are connected together at a connection portion P.

The configuration of the connection P is not particularly limited. In the present embodiment, a cross joint having connection ports in the four directions is used as the connection portion P.

In addition, in the circulation path 30, a first bypass pipe 53 is provided to ensure a flow passage of the coolant C in case the first pump 11 stops. The first bypass pipe 53 connects the first inlet 11a side of the first pump 11 and the connection portion P, thereby the first pump 11 is bypassed by the first bypass pipe 53.

In similar fashion, a second bypass pipe 54 is provided in the circulation path 30 to ensure a flow passage of the coolant C in case the second pump 12 stops. The second bypass pipe 54 connects the second outlet 12b side of the second pump 12 and connection portion P, thereby the second pump 12 is bypassed by the second bypass pipe 54.

In addition, in the present embodiment, the directions of the first main pipe 51 and the second bypass pipe 54 at the connection portion P are aligned in the same direction $G_1$, and the directions of the second main pipe 52 and the first bypass pipe 53 at the connection portion P are aligned in the same direction $G_2$.

Since the cross joint used as the connection portion P connects each pipe substantially at one point, the first main pipe 51 and the second bypass pipe 54 are positioned on a straight line $L_1$, and the second main pipe 52 and the first bypass pipe 53 are positioned on a straight line $L_2$.

Note that the inner diameters and the outer diameters of the first and second main pipes 51 and 52, and the first and second bypass pipes 53 and 54 are not particularly limited. In the present embodiment, the inner diameters of these pipes are approximately set to 4 mm to 4.35 mm and the outer diameters of these pipes are approximately set to 6 mm to 6.35 mm.

In addition, the materials for the first and second main pipes 51 and 52, and the first and second bypass pipes 53 and 54 are also not particularly limited. Examples of the material for the pipes include metals such as cupper, stainless steel, and aluminum, and resin such as fluoroplastic and polyether ether ether ketone (PEEK).

In addition, the connection angle of each pipe at the connection portion P is also not particularly limited. In this example, angle θ between the first main pipe 51 and the first bypass pipe 53 is set to 90 degrees.

Next, descriptions are provided for operation of the cooling apparatus 50.

Hereinafter, descriptions are provided for each of the case where both the first pump 11 and the second pump 12 are working, and the case where one of these pumps is stopped.

FIG. 10A is a diagram schematically illustrating the case where both the first pump 11 and the second pump 12 are working.

FIG. 10B is a diagram schematically illustrating a flow of the coolant C in this case. Note in FIG. 10B that the magnitude of the flow rate of the coolant C is indicated by the thickness of the arrows, and a thicker arrow indicates a larger flow rate of the coolant C. This is also the case for FIGS. 11B and 12B to be described later.

As illustrated in FIG. 10B, in this case, the coolant C mainly flows inside the first main pipe 51 and the second main pipe 52, which directly receive the driving forces of the first pump 11 and the second pump 12, respectively.

On the other hand, FIG. 11A is a diagram schematically illustrating the case where the first pump 11 is stopped and the second pump 12 is working.

Figure 12A:
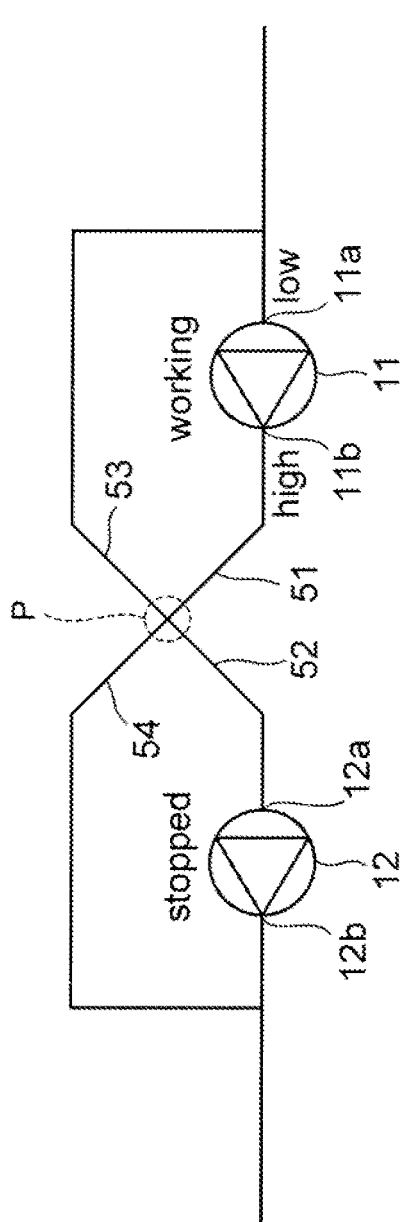
FIG. 12A is a diagram schematically illustrating a case where the first pump is working and the second pump is stopped in the present embodiment.

Note in FIG. 11A and undermentioned FIG. 12A that "high" is affixed where the pressure of the coolant C is high, and "low" is affixed where the pressure of the coolant C is lower than the pressure at the portion with "high". These words indicate a relative pressure difference in the circulation path 30. The pressure at the outlets 11b and 12b of the working pumps 11 and 12 is used as a reference of "high", and the pressure at the inlets 11a and 11b is used as a reference of "low".

For example, the pressure of the coolant C is "high" at the second outlet 12b of the second pump 12, where the coolant C immediately after being discharged from the second pump 12 flows.

In contrast, the pressure of the coolant C is "low" at the second inlet 12a of the second pump 12, where the coolant C immediately before being taken in the second pump 12 flows.

FIG. 11B is a diagram schematically illustrating a flow of the coolant C in this case.

In this case, as illustrated in FIG. 11B, the coolant C flows through the first bypass pipe 53 to bypass the stopped first pump 11.

Here, because the first bypass pipe 53 and the second main pipe 52 are connected in the same direction at the connection portion P in the present embodiment, the coolant C coming out of the first bypass pipe 53 does not practically receive any resistance at the connection portion P, and most of the coolant C flows into the second main pipe 52.

As a result, even when the pressure difference of the coolant C occurs between the second inlet 12a and the second outlet 12b as described above, the momentum of the coolant C flowing from the first bypass pipe 53 into the second main pipe 52 overcomes the pressure difference, and makes it difficult for the coolant C to flow backward through the second bypass pipe 54 in the direction of arrow A.

Especially, by making the inner diameters of the first bypass pipe 53 and the second main pipe 52 equal, the inner diameters does not change at the connection portion P. Therefore, it is possible to guide the coolant C smoothly from the first bypass pipe 53 into the second main pipe 52 to prevent the backward flow of the coolant C effectively.

In addition, a check valve to prevent the backward flow does not need to be provided at the second bypass pipe 54. Therefore, the need for a controller to control opening and closing of the check valve is eliminated, thereby simplifying the structure of the apparatus.

Moreover, there is no risk that the flow rate of the coolant C flowing through the first bypass pipe reduces due to resistance received from the check valve. Furthermore, since there is no movable part such as the check valve, the reliability of the apparatus improves.

Meanwhile, FIG. 12A is a diagram illustrating the case where the first pump 11 is working and the second pump 12 is stopped.

Figure 12B:
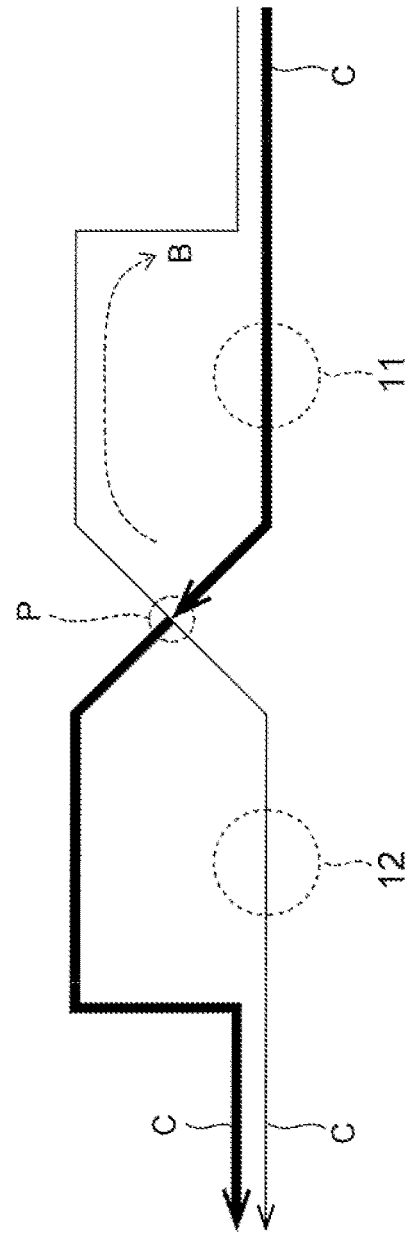
FIG. 12B is a diagram schematically illustrating a flow of the coolant in the case where the first pump is working and the second pump is stopped in the present embodiment.

FIG. 12B is a diagram schematically illustrating a flow of the coolant C in this case.

Also in this case, since the first main pipe 51 and the second bypass pipe 54 are connected in the same direction at the connection portion P as described above, the coolant C coming out of the first main pipe 51 does not practically receive any resistance at the connection portion P, and most of the coolant C flows into the second bypass pipe 54.

Hence, even when the pressure difference of the coolant C occurs between the first inlet 11a and the first outlet 11b, the momentum of the coolant C flowing from the first main pipe 51 into the second bypass pipe 54 overcomes the pressure difference, and makes it difficult for the coolant C to flow backward through the first bypass pipe 53 in the direction of arrow B.

Note that the inner diameters of the second bypass pipe 54 and the first main pipe 51 may be made equal to guide the coolant C smoothly from the first main pipe 51 into the second bypass pipe 54, thereby preventing the backward flow of the coolant C effectively.

The inventors of the present application investigated to what extent the backward flow is reduced in the present embodiment.

The investigation result is indicated in FIG. 13.

As the investigation method, such an approach was employed which measures the total flow rate of the coolant C flowing through the circulation path 30, and determines based on the measured value whether or not a backward flow is occurring in the bypass pipes.

In this investigation, a comparative example is also investigated, where the bypass pipes 13 and 14 are connected as in FIG. 1.

Note that in FIG. 13, "normal operation" means the state where both the first pump 11 and the second pump 12 are working. In this "normal operation", outputs of the both of the first pump 11 and the second pump 12 were set to 100%.

In contrast, "one pump stopped" means the state where the first pump 11 is working and the second pump 12 is stopped. In this case, the output of the first pump 11 was set to 100%, and the output of the second pump 12 was set to 0%.

In addition, all the outer diameters of the first and second main pipes 51 and 52, and the first and second bypass pipes 53 and 54 according to the present embodiment were set to 6.35 mm, and the inner diameters of these pipes were set to 4.35 mm. Note that the sizes of the first and second bypass pipes 13 and 14 according to the comparative example were set to the same values as these.

As indicated in FIG. 13, in the comparative example, the total flow rate of the coolant C decreases by about 33% when one pump stops as compared to the case of the normal operation. In contrast, in the present embodiment, the decrease is suppressed to 26%, which is lower than 7% of the comparative example.

The decrease in the total flow rate is caused since the second pump 12 is stopped, and also the backward flow is caused in the bypass pipe. Therefore, the reduction of the decrease in the total flow rate in the present embodiment than the comparative example indicates that backward flow of the coolant C in the second bypass pipe 54 is suppressed.

From this result, it was confirmed that connecting the first main pipe 51 and the second bypass pipe 54 in the same direction and connecting the second main pipe 52 and the first bypass pipe 53 in the same direction at the connection portion P as in the present embodiment are effective to reduce the backward flow of the coolant C.

Moreover, it was found that by preventing the backward flow in this manner, the total flow rate (390 ml/min) with one pump stopped in the present embodiment becomes larger than the total flow rate (310 ml/min) with one pump stopped in the comparative example.

Note that it was also found that not only in the operation with one pump stopped but also in the normal operation, the total flow rate (530 ml/min) in the present embodiment becomes higher than the total flow rate (460 ml/min) in the comparative example.

Next, descriptions are provided for various modification examples of the present embodiment.

First Example

Figure 14:
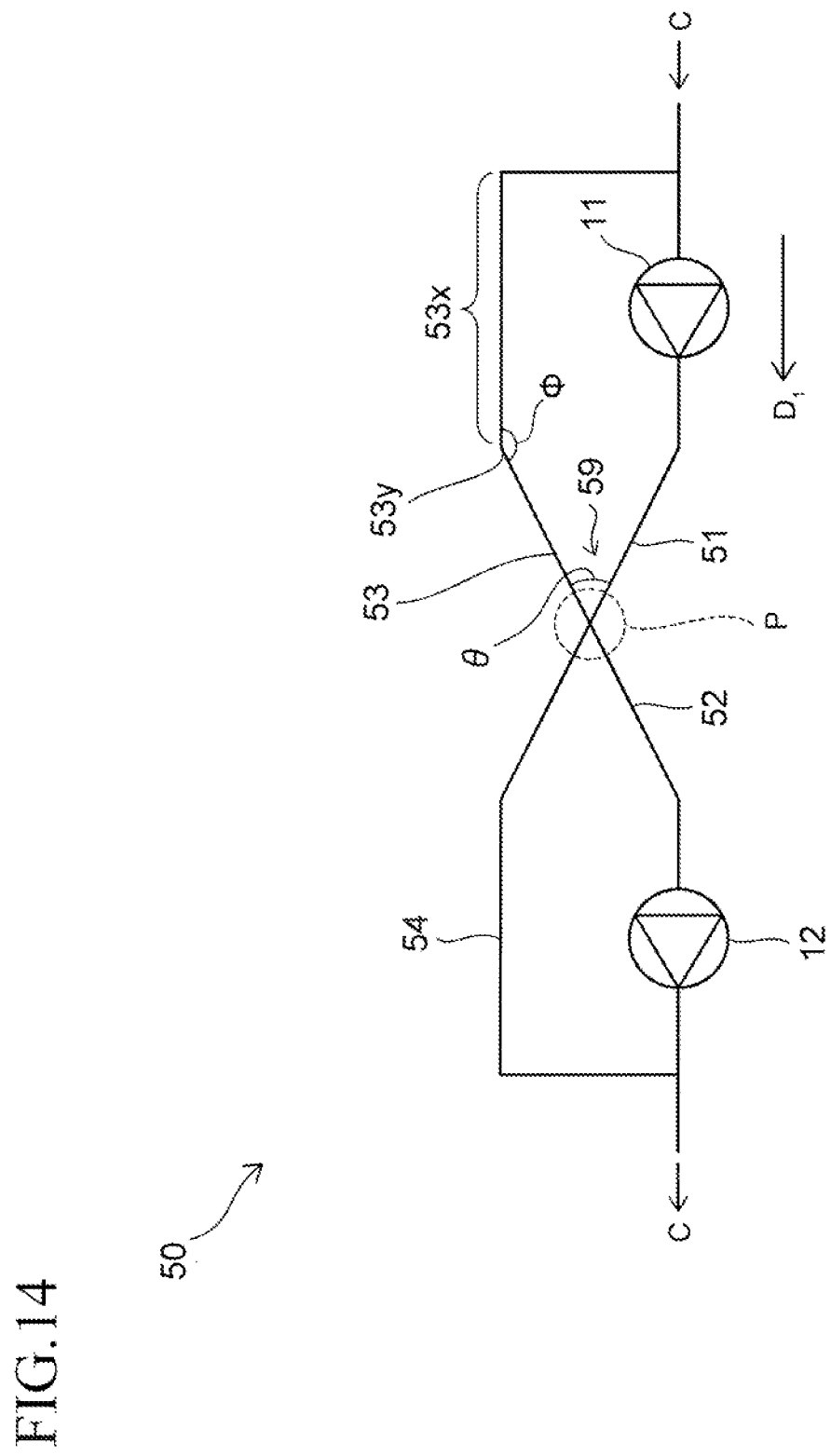
FIG. 14 is an enlarged structural diagram of the cooling apparatus according to a first example of the present embodiment.

FIG. 14 is an enlarged structural diagram of the cooling apparatus 50 according to a first example.

In this example, as illustrated in FIG. 14, by setting the aforementioned angle θ to 0 to 90 degrees, angle 59 formed by the first main pipe 51 and the first bypass pipe 53 is made acute.

Since the first bypass pipe 53 bypasses the first pump 11 as described above, a parallel portion 53x, which is parallel to sending direction $D_1$ in which the first pump 11 sends out the coolant C, inevitably exists in the first bypass pipe 53.

In order to provide the parallel portion 53x, a bent portion 53y may be provided in the first bypass pipe 53 that extends from the connection portion P.

In this example, since the angle θ was set to 0 to 90 degrees as described above, bending angle φ of the bent portion 53y can be made obtuse, which makes it easy to form the bent portion 53y by bending the first bypass pipe 53.

Second Example

Figure 15:
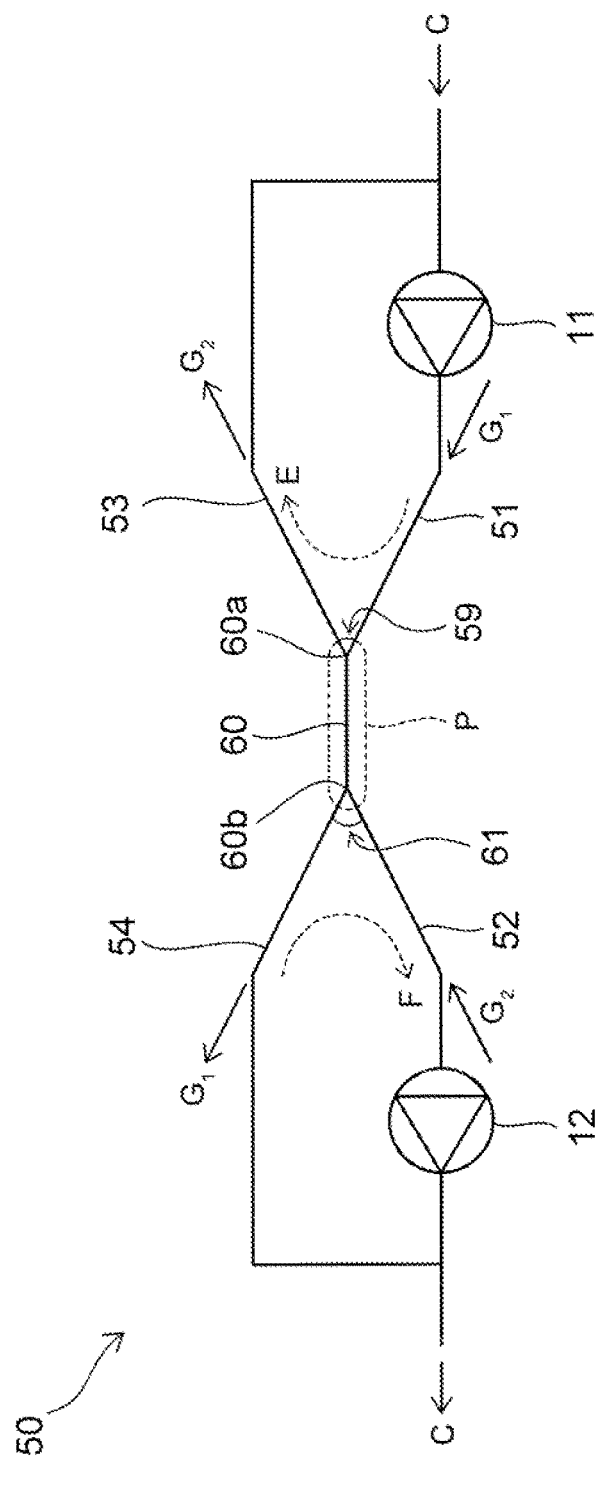
FIG. 15 is an enlarged structural diagram of the cooling apparatus according to a second example of the present embodiment.

FIG. 15 is an enlarged structural diagram of the cooling apparatus 50 according to a second example.

In this example, as illustrated in FIG. 15, the angle 59 between the first main pipe 51 and the first bypass pipe 53 is made acute as in the first example, and a pipe 60 is provided as the connection portion P. Note that angle 61 between the second main pipe 52 and the second bypass pipe 54 is also made acute.

Then, the first main pipe 51 and the first bypass pipe 53 are connected to one end 60a of the pipe 60, and the second main pipe 52 and the second bypass pipe 54 are connected to the other end 60b of the pipe 60.

Also, in this example, the first main pipe 51 and the second bypass pipe 54 are aligned in the same direction $G_1$ at the connection portion P, and the second main pipe 52 and the first bypass pipe 53 are aligned in the same direction $G_2$ at the connection portion P.

The investigation conducted by the inventors of the present application revealed that even when the pipe 60 is provided as the connection portion P in this manner, the backward flow of the coolant C in the first bypass pipe 53 and the second bypass pipe 54 can be reduced.

The reason is considered as follows.

For example, assume the case where the first pump 11 is working and the second pump 12 is stopped.

In this case, even when the coolant C tries to flow backward into the first bypass pipe 53 as indicated by arrow E, the acute angle 59 is difficult for the coolant C to turn, making it difficult for the coolant C to flow backward into the first bypass pipe 53.

In similar fashion, in the case where the first pump 11 is stopped and the second pump 12 is working, the acute angle 61 is difficult for the coolant C to turn, making it difficult for the coolant C to flow backward into the second bypass pipe 54 as indicated by arrow F.

Note that although the cross-sectional area of the pipe 60 is not particularly limited, it is preferable that the cross-sectional area of the pipe 60 be equal to the sum of the cross-sectional area of the first main pipe 51 and the cross-sectional area of the first bypass pipe 53. This makes it difficult for the coolant C flowing from each of the first main pipe 51 and the first bypass pipe 53 into the pipe 60 to receive resistance caused by the difference in the cross-sectional area, and allows the coolant C to flow smoothly.

Although descriptions have been provided for the present embodiment as above, the embodiment is not limited to the above.

For example, although in the above, evaporation heat absorbed in the phase transition of the coolant C from the liquid phase to the vapor phase is used to cool the electronic component 23, the electronic component 23 may be cooled using sensible heat of the coolant C in the liquid phase without evaporating the coolant C as described above.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling apparatus comprising:
a circulation path in which a coolant circulates to cool an electronic component;
a first pump provided in the circulation path, the first pump including a first inlet configured to take in the coolant and a first outlet configured to discharge the coolant;
a second pump connected to the first pump in series in the circulation path, the second pump including a second inlet configured to take in the coolant and a second outlet configured to discharge the coolant;
a first main pipe positioned on a first straight line with one end that is connected to the first outlet;
a second main pipe positioned on a second straight line with one end that is connected to the second inlet, where the second straight line being different from the first straight line;
a connection portion configured to connect another end of the first main pipe and another end of the second main pipe;
a first bypass pipe positioned on the second straight line configured to bypass the first pump by connecting the first inlet side of the first pump and the connection portion; and a second bypass pipe positioned on the first straight line configured to bypass the second pump by connecting the second outlet side of the second pump and the connection portion, wherein the first main pipe and the second bypass pipe are connected in a same direction in the connection portion, and the second main pipe and the first bypass pipe are connected in a same direction in the connection portion.

2. The cooling apparatus according to claim 1, wherein an angle formed by the first main pipe and the first bypass pipe is acute.

3. The cooling apparatus according to claim 2, wherein the connection portion is a pipe, the first main pipe and the bypass pipe are connected to one end of the pipe, and the second main pipe and the second bypass pipe are connected to another end of the pipe.

4. The cooling apparatus according to claim 2, wherein a cross-sectional area of the pipe is equal to a sum of a cross-sectional area of the first main pipe and a cross-sectional area of the first bypass pipe.

5. The cooling apparatus according to claim 1, wherein an inner diameter of the first bypass pipe is equal to an inner diameter of the second main pipe, and an inner diameter of the second bypass pipe is equal to an inner diameter of the first main pipe.

6. An electronic device comprising:

an electronic component, and a cooling apparatus configured to cool the electronic component, wherein the cooling apparatus includes:

a circulation path in which a coolant circulates to cool an electronic component;

a first pump provided in the circulation path, the first pump including a first inlet configured to take in the coolant and a first outlet configured to discharge the coolant;

a second pump connected to the first pump in series in the circulation path, the second pump including a second inlet configured to take in the coolant and a second outlet configured to discharge the coolant;

a first main pipe positioned on a first straight line with one end that is connected to the first outlet;

a second main pipe positioned on a second straight line with one end that is connected to the second inlet, where the second straight line being different from the first straight line;

a connection portion configured to connect another end of the first main pipe and another end of the second main pipe;

a first bypass pipe positioned on the second straight line configured to bypass the first pump by connecting the first inlet side of the first pump and the connection portion; and a second bypass pipe positioned on the first straight line configured to bypass the second pump by connecting the second outlet side of the second pump and the connection portion, wherein the first main pipe and the second bypass pipe are connected in a same direction in the connection portion, and the second main pipe and the first bypass pipe are connected in a same direction in the connection portion.

* * * * *